(12) United States Patent
Jung et al.

(10) Patent No.: US 6,403,287 B1
(45) Date of Patent: Jun. 11, 2002

(54) PROCESS FOR FORMING A PHOTORESIST PATTERN IMPROVING RESISTANCE TO POST EXPOSURE DELAY EFFECT

(75) Inventors: Jae Chang Jung, Kyoungki-do; Jin Soo Kim, Daejeon; Hyoung Gi Kim, Kyoungki-do, all of (KR)

(73) Assignee: Hyundai Electronics Industries Co., Ltd. (KR)

(*) Notice: Subject to any disclaimer, the term of this patent is extended or adjusted under 35 U.S.C. 154(b) by 0 days.

(21) Appl. No.: 09/524,024

(22) Filed: Mar. 10, 2000

(30) Foreign Application Priority Data

Apr. 8, 1999 (KR) .......................................... 99-12383

(51) Int. Cl.[7] .............................................. G03F 7/039
(52) U.S. Cl. ...................... 430/322; 430/320; 430/330; 430/349; 430/327; 427/512; 427/521
(58) Field of Search ................................ 430/320, 322, 430/330, 327, 349, 9, 18; 427/512, 498, 521, 160

(56) References Cited

U.S. PATENT DOCUMENTS

| | | | |
|---|---|---|---|
| 5,585,222 A | * 12/1996 | Kaimoto et al. | 430/296 |
| 5,863,338 A | * 1/1999 | Yamada et al. | 118/719 |
| 6,174,651 B1 | * 1/2001 | Thakur | 430/327 |
| 6,177,238 B1 | * 1/2001 | Fuller et al. | 430/320 |
| 6,309,793 B1 | * 10/2001 | Malik et al. | 430/270.1 |

FOREIGN PATENT DOCUMENTS

| | | | | |
|---|---|---|---|---|
| JP | 59114820 A | * 7/1984 | ........... | H01L/21/30 |
| JP | 2001068490 A | * 3/2001 | ........... | H01L/21/56 |

OTHER PUBLICATIONS

Jane M. Shaw, *IBM Journal of Research and Development*, 1997, 41, 81–94.

F.M. Houlihan, et al., "Photogenerators of Sulfamic Acids; Use in Chemically Amplified Single Layer Resists," Journal of Photopolymer Science and Technology, 1998, vol. II, No. 3, pp. 419–430.

J. Byers, et al. "Recent Advancements In Cycloolefin Based Resists For ArF Lithography,", Journal of Photopolymer Science Technology, 1998, vol. II, No. 3, pp. 465–474.

* cited by examiner

*Primary Examiner*—Janet Baxter
*Assistant Examiner*—Yvette M. Clarke
(74) *Attorney, Agent, or Firm*—Townsend and Townsend and Crew LLP

(57) ABSTRACT

The present invention relates to a process for forming a photoresist pattern which improves its resistance to the harmful effects of post exposure delay. More specifically, it relates to an improved process for forming a photoresist pattern comprising the steps of (a) coating a photoresist composition on a wafer, (b) exposing the coated wafer to patterned light by employing an exposer, and (c) developing the exposed wafer, wherein the improvement comprises raising the temperature of the photoresist to above room temperature when it is coated on the wafer.

12 Claims, 2 Drawing Sheets

| delay time / temp. | 10 min delay | 20 min delay | 20 min delay |
|---|---|---|---|
| 50°C | | | |
| | 11 mJ/cm² | 11.5 mJ/cm² | 12 mJ/cm² |
| 40°C | | | |
| | 9 mJ/cm² | 9 mJ/cm² | 11 mJ/cm² |
| | 150nm 1:1 L/S | 150nm 1:1 L/S | 130nm 1:1 L/S |

PROCESS FOR FORMING A PHOTORESIST PATTERN IMPROVING RESISTANCE TO POST EXPOSURE DELAY EFFECT

FIELD OF THE INVENTION

The present invention relates to a process for forming a photoresist pattern in the manufacture of a semiconductor device. More particularly, it relates to a process for forming a fine photoresist pattern which improves the resistance of the pattern to the "post exposure delay effect" by controlling the temperature of the photoresist composition while it is coated on the semiconductor substrate.

BACKGROUND OF THE INVENTION

In the photolithography process for forming semiconductor devices, resolution depends upon the wavelength of the light source—the shorter the wavelength, the more minute the pattern that can be formed.

Recently, chemical amplification-type photoresists for use with deep ultra-violet light sources ("DUV photoresists") have been investigated in order to achieve high sensitivity in the minute image-formation processes used in photolithography processes for preparing semiconductor devices. Such photoresists are prepared by blending a photoacid generator and matrix resin polymer having an acid labile group to form a photoresist composition which is coated on a substrate, for example a silicon wafer.

According to the reaction mechanism of such a photoresist, the photoacid generator generates acid when it is illuminated by a light source, and the main chain or branched chain of the resin reacts with the generated acid to be decomposed or crosslinked. The polarity change of the resin induces solubility differences between the exposed portion and unexposed portion in the developing solution, to form a predetermined pattern.

In general, an acceptable photoresist (sometimes abbreviated herein as "PR") must satisfy various requirements such as excellent etching resistance, heat resistance and adhesiveness, and more preferably, it should have the ability to be developed in a 2.38 wt % aqueous tetramethylammonium hydroxide (TMAH) solution. However, it is very difficult to synthesize a polymer that satisfies all of these requirements. For example, a polymer having a polyacrylate main chain can be easily synthesized, but it has poor etching resistance and has difficulties in the developing process. In order to secure etching resistance, it has been considered to add an alicyclic unit to the main chain of the PR polymer. However, in this case, another practical problem occurs in the process for manufacturing the semiconductor. That is, the acid generated by exposure of the photoresist may react with environmental amine compounds and thereby be reduced during the time between exposure and post exposure baking ("post exposure delay effect"). Thus, the resultant pattern may be deformed or the formed pattern may have a T-shape (i.e., "T-topping" of the pattern). The concentration of amine must be minimized in the manufacturing environment because these phenomena become more serious when the concentration of environmental amine is more than 30ppb.

Some methods to overcome these phenomena have been described in the prior art; for example, (1) adding amine to the PR composition, (2) adding a "sweet" photoacid generator to the PR composition (See Frank Houlihan et al., Journal of Photopolymer Science and Technology, Vol. 11, No. 3, 1998, 419–430), and (3) improving the PR resin itself (See J. Byers et al., Journal of Photopolymer Science and Technology, Vol. 11, No. 3, 1998, 465–474). However, these methods require additional processes to control the concentration of amine in the environment, because they are only effective when the concentration of environmental amine is less than 5ppb, thereby resulting in a high manufacturing cost.

SUMMARY OF THE INVENTION

An object of the present invention is to overcome the disadvantages described above, and to provide a process for forming a fine photoresist pattern in the manufacture of semiconductor devices. The process of the present invention improves the resistance of the photoresist pattern to post exposure delay effect by controlling the temperature of the photoresist composition while it is being coated on the semiconductor substrate.

BRIEF DESCRIPTION OF THE DRAWINGS

FIG. 2 shows photoresist patterns obtained from embodiments of the present invention.

DETAILED DESCRIPTION OF THE INVENTION

Figure 1:
FIG. 1 shows the photoresist pattern obtained in Comparative Example 1.

The general process for forming a photoresist pattern comprises the steps of (a) coating a photoresist composition on a wafer, preferably made of silicon (b) exposing the coated wafer to patterned light by employing an exposer, and (c) developing the exposed wafer. In the present invention, the temperature of the photoresist composition is raised above room temperature when it is coated on the wafer.

The photoresist composition used for forming the photoresist layer is generally kept at room temperature, i.e., 20° C. to 25° C., prior to coating. However, in accordance with the present invention, the photoresist composition is heated to 30° C.–80° C., for example, by an in-line heater during delivery of the composition to the spray nozzle of the spin-coater, and is then spin-coated on the wafer to enhance its resistance against post exposure delay effect.

In order to form a photoresist pattern using the above method, the heated photoresist is spin-coated on a silicon wafer, and "soft-baked," i.e., heated at about 150° C. for about 90 seconds. Then, the photoresist is exposed to 1 to 30 mJ/cm$^2$ of light energy using exposure equipment with ArF, KrF, E-beam, EUV or X-ray radiation, and is then "post-baked" at a temperature of about 10° C. to 200° C. for about 1 to 5 minutes. Then, the wafer is developed in an alkaline developing solution, for example 2.38 wt % or 2.5 wt % aqueous TMAH (tetramethylammonium hydroxide) solution, to obtain a micro pattern, preferably of 0.15 µm or less.

The present inventors have found that the practice of the present invention may change the three-dimensional structure of the photoresist polymer molecules in the photoresist composition being coated to produce a coated photoresist layer having excellent stability to post exposure delay effect.

Generally, there are many gaps among molecules when photoresist resins containing alicyclic units are coated on a wafer substrate to form the photoresist layer of a semiconductor device. These gaps make it easy to exhaust acids generated from photoresist layer by exposure and also allow the photoresist layer to be permeated by amines which react with and thereby remove the generated acids. It is impossible to form micro patterns if post exposure delay effect occurs, since the generated acids are neutralized by environmental amines which permeate the photoresist layer. As a result, chemical amplification cannot be carried out by evaporation of acids when the photoresist layer is post-baked, i.e. baked at high temperature in order to diffuse acid before development.

The above problems can be solved in accordance with the present invention by coating a heated photoresist composition on the substrate, thereby forming a coated PR layer with a reduced number of gaps among the polymer molecules. It is believed that the above-mentioned gaps among polymer molecules are reduced when the photoresist composition is heated during spin-coating because the polymer molecules in the heated photoresist composition are formed into rigid rod, oval or helix shapes. These shapes orient parallel to each other and therefore are coated in a more tightly packed structure, thereby producing little or no gaps between molecules in the coated layer and providing good photoresist patterns even though there is a post exposure delay.

DETAILED DESCRIPTION OF PREFERRED EMBODIMENT

The invention is described in more detail by referring to the Examples below, but it should be noted that the present invention is not restricted to these examples by any means.

The concentration of the environmental amines is kept at 35 ppb in all the following examples.

COMPARATIVE EXAMPLE 1

(i) a resin of the following Chemical Formula 1, comprising only alicyclic units (1g), and (ii) the photoacid generator triphenylsulfonium triflate (0.012 g) were dissolved in (iii) propylene glycol methyl ether acetate (7 g) to obtain a photoresist composition.

Chemical Formula 1

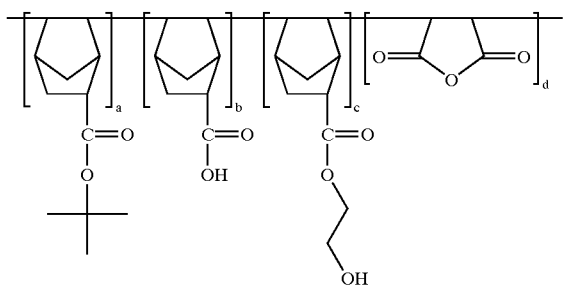

wherein a, b, c and d individually represent the relative amount of each comonomer.

This photoresist composition was spin-coated on wafers pretreated with hexamethyldisilazane (HMDS) at room temperature (23° C.) and baked at 150° C. for 90 seconds. After baking, 20 dies were exposed to light by using an ArF laser exposer, increasing the amount of exposing light for each successive die by 1 mJ/cm$^2$ from 10 mJ/cm$^2$ to 29 mJ/cm$^2$. After 10 minutes of delay, the dies were then baked again at 140° C. for 90 seconds.

When the baking was completed, the wafers were developed in 2.38 wt % aqueous tetramethylammonium hydroxide (TMAH) solution. The resultant pattern was deformed, or exhibited T-topping, for example, as shown in FIG. 1, since acids generated by the exposure were removed by the amines existing in the environment.

COMPARATIVE EXAMPLE 2

The procedure according to Comparative Example 1 was repeated, but the temperature of the photoresist composition during spin-coating was raised to 82° C. instead of room temperature. As a result, needle-shaped defects broke out in the pattern formed in the coated PR layer because of the rapid volatilization of the solvent in the PR composition at 82° C.

INVENTION EXAMPLE (i) a resin of the above Chemical Formula 1, comprising only alicyclic units (1g), and (ii) the photoacid generator triphenylsulfonium triflate (0.012 g) were dissolved in (iii) propylene glycol methyl ether acetate (7 g) to obtain a photoresist composition.

This photoresist composition was spin-coated on wafers pretreated with HMDS with the temperature of the composition being increased to 40° C. and 50° C. respectively before it reached the spray nozzle. The coated wafers were then baked at 150° C. for 90 seconds. After baking, 20 dies were exposed to light by using an ArF laser exposer, increasing the amount of exposing light for each successive die by 1 mJ/cm$^2$ from 10 mJ/cm$^2$ to 29 mJ/cm$^2$. After 10 minutes and 20 minutes of delay, the dies were then baked again at 140° C. for 90 seconds.

When the baking was completed, the wafers were developed in 2.38 wt % aqueous TMAH to obtain satisfactory 0.15 and 0.13 $\mu$m L/S patterns, as shown in FIG. 2.

These results establish indirectly that the shapes of the PR polymer molecules resulting from the present invention are rigid rod, oval or helix since these shapes are correlated to good photolithography patterns which are stable to post exposure delay effect. By heating the PR composition, the PR polymer molecule takes on a shape that reduces the gaps among the PR polymer molecules when coated as a PR layer, thereby inhibiting amines from penetrating into the coated PR layer.

Moreover, the present invention reduces the cost of the photolithography process since excellent PR patterns can be obtained merely by raising the temperature of the PR composition during coating.

What is claimed is:

1. A process for forming a photoresist pattern comprising the steps of (a) spin-coating a heated photoresist composition which is at above room temperature on a wafer, (b) exposing the coated wafer to light by employing an exposer, and (c) developing the exposed wafer.

2. A process according to claim 1 wherein the temperature of the heated photoresist composition is from about 30° C. to 80° C.

3. A process according to claim 1 wherein the temperature of the photoresist composition is kept at 20° C. to 25° C. before coating.

4. A process according to claim 1 wherein the heated photoresist composition is heated to 30° C.–80° C. by a heater during delivery to a spray nozzle used to spin-coat the the wafer.

5. A process according to claim 1 which further comprises baking step(s) before and/or after step (b).

6. A process according to claim 5 wherein the baking step(s) is carried out at a temperature of 10° C. to 200° C.

7. A process according to claim 1 wherein the exposing step (b) is carried out by using an ArF, KrF, E-beam, X-ray, ion beam, EUV or DUV light source.

8. A process according to claim 1 wherein step (b) is carried out by irradiating the coated wafer with 1 to 30 mJ/cm$^2$ of light-exposure energy.

9. A process according to claim 1 wherein the developing step is carried out by using an alkaline developing solution.

10. A process according to claim 9 wherein the alkaline developing solution is a 2.38 wt % or 2.5 wt % aqueous TMAH (tetramethylammonium hydroxide) solution.

11. A process according to claim 1 wherein the photoresist composition contains a polymer comprising only alicyclic units.

12. A semiconductor element manufactured by the process according to claim 1.

* * * * *

UNITED STATES PATENT AND TRADEMARK OFFICE
CERTIFICATE OF CORRECTION

PATENT NO.     : 6,403,287 B1
DATED          : June 11, 2002
INVENTOR(S)    : Jae Change Jung, Jin Soo Kim and Hyoung Gi Kim It is certified that error appears in the above-identified patent and that said Letters Patent is hereby corrected as shown below:

<u>Column 4,</u>
Line 54, please insert -- composition on -- after the words "spin-coat the".

Signed and Sealed this

Eleventh Day of March, 2003

JAMES E. ROGAN
*Director of the United States Patent and Trademark Office*